United States Patent [19]
Aoyama et al.

[11] Patent Number: 5,048,094
[45] Date of Patent: Sep. 10, 1991

[54] METHOD AND APPARATUS FOR CHECKING PATTERN

[75] Inventors: Yoshiyuki Aoyama; Takahiro Nakano, both of Fugisawa; Osamu Kanasashi, Ebina, all of Japan

[73] Assignee: Nippon Seiko Kabushiki Kaisha, Tokyo, Japan

[21] Appl. No.: 426,574

[22] Filed: Oct. 24, 1989

[30] Foreign Application Priority Data

Nov. 29, 1988 [JP] Japan .................................. 63-301866

[51] Int. Cl.⁵ ............................................ G06K 9/00
[52] U.S. Cl. ............................................ 382/8; 382/46
[58] Field of Search ............................ 382/8, 46, 106; 358/237

[56] References Cited

U.S. PATENT DOCUMENTS

| | | | |
|---|---|---|---|
| 4,533,959 | 8/1985 | Sakurai | 382/46 |
| 4,658,428 | 4/1987 | Bedros et al. | 382/46 |
| 4,776,023 | 10/1988 | Hamada et al. | 382/8 |
| 4,829,452 | 5/1989 | Kang et al. | 382/46 |
| 4,926,489 | 5/1990 | Danielson et al. | 382/8 |
| 4,928,313 | 5/1990 | Leonard et al. | 382/8 |
| 4,929,085 | 5/1990 | Kajihara | 382/46 |

FOREIGN PATENT DOCUMENTS

| | | |
|---|---|---|
| 4934385 | 7/1972 | Japan . |
| 55-105329 | 8/1980 | Japan . |
| 60-21523 | 2/1985 | Japan . |
| 60-126830 | 7/1985 | Japan . |

*Primary Examiner*—Stephen Brinich
*Attorney, Agent, or Firm*—Basile and Hanlon

[57] ABSTRACT

A pattern formed on an object under check such as a mask, printed substrate, etc., is scanned by a CCD camera, and check pattern data for one scanning line obtained from the CCD camera is divided into a plurality of pixel groups and stored in shift register groups. The check pattern data is compared with a master pattern data representing the external shape of a master pattern to calculate an inclination of the check pattern (pattern to be checked) with respect to the master pattern. The order of reading addresses of the shift register groups is changed in accordance with the inclination so that the check pattern data matches the master pattern data. Thereafter, the check pattern data is compared with the master pattern data to detect a defect in the check pattern to thereby avoid erroneous judgment due to an angular deviation between the check pattern and the master pattern.

12 Claims, 9 Drawing Sheets

P CHECK PATTERN

METHOD AND APPARATUS FOR CHECKING PATTERN

FIELD OF THE INVENTION

The present invention relates to a method and apparatus for checking the absence or presence of a defect in a pattern formed on a mask, reticle, printed substrate, or the like.

DESCRIPTION OF THE RELATED ART

Generally, in checking for a defect in a pattern formed on a mask, reticle, printed substrate, or the like, a comparison between a mask pattern and a check pattern under check is carried out.

Prior art defect checking methods are described, for example, in Japanese Patent Laid-Open Publication No. 55-105329 (first prior art example), and Japanese Patent Laid-Open Publication No. 49-34385 (second prior art example).

In the first prior art example, a first scanning signal generated in accordance with standard pattern data is compared and collated with a second scanning signal obtained by scanning a pattern to be checked to thereby detect a defective pattern. In this case, the widths of the standard pattern and the pattern to be checked in a scanning direction are detected as count values of clock pulses. Both of the count values are compared with each other to determine the absence or presence of a defect.

In the second prior art example, an image of an object pattern is sequentially cut out as a local two-dimensional binary image, and in every of a plurality of partial areas taken to completely surround a center pixel of the local two-dimensional binary image, whenever a pixel having a logical state opposite to the logical state of the center pixel is contained, a logical processing for an output is performed.

However, in the first and second prior art examples, since the standard pattern and the pattern to be checked are compared with each other, it is the premise that both the patterns are matched with each other without an angular deviation. In order to achieve this matching, there are known methods for checking a defect in a pattern from Japanese Patent Laid-Open Publication No. 60-21523 (third prior art example) and Japanese Patent Laid-Open Publication No. 59-126830 (fourth prior art example).

Specifically, in the third prior art example, the defect checking method of a photomask is disclosed in which at least three marks are formed on the mask as position registering marks. Each center position of these marks is detected by a signal detection section from a scanning signal corresponding to the pattern to be checked which is obtained by scanning the mask by a light illuminating section in one direction. Based on the coordinates of each of the center positions, the amount of expansion or contraction in an X-direction, the amount of expansion or contraction in a Y-direction, and a deviation of orthogonality are obtained. Then, position information for generating a scanning signal for comparison in a standard signal generating section is corrected thereby to prevent an erroneous judgement due to a positional deviation between the pattern to be checked and the master pattern.

In the fourth prior art example, a one-dimensional line sensor used for scanning is inclined at a certain angle with respect to a scanning area in an object under check, and scanning is performed in this condition to thereby prevent a deviation in a line direction with respect to the image.

However, in the first and second prior art examples, in either case, a two-dimensional image of the pattern is merely converted to a binary image, and a defective pattern is extracted based on image data of the binary image. In other words, a defect judgement is performed by a fixed standard for one pattern. Accordingly, for example, even when there exists a pattern which is allowable with respect to a slight pattern deviation between the pattern to be checked and the master pattern, the defect judgement is performed based on the fixed standard. As a result, if the accuracy for extracting the defect is made high, for example, a through hole of a printed substrate which is formed by punching or drilling and thus difficult to form with high accuracy and a pattern whose pattern deviation does not affect a small deviation much will be judged as being defective. Furthermore, if this defect data increases to an enormous amount, rechecking by humans will require many man-hours. On the other hand, if the defect extraction accuracy is lowered, the defect judgement for a pattern portion including such through holes which are not required to be formed with high accuracy will become lose, and the number of recheckings will be reduced. However, the possibility of failure to extract a defect in a pattern portion which requires a high accuracy will be increased. Therefore, in either case, there has been an unsolved problem in that a defect checking which satisfies both the accuracy and the reduction of the number of recheckings cannot be performed.

Furthermore, in the third prior art example in which a deviation between the standard pattern and the pattern to be checked is corrected, it is necessary to provide at least three position registering marks on a member to be checked separately from that on the pattern to be checked. Further, it is necessary to read these position registering marks and to detect the coordinates of a center position of each of the marks. Accordingly, there has been an unsolved problem in that the apparatus becomes large, complex and separately requires a means for reading the position registering marks of the pattern.

Moreover, the fourth prior art example is effective in correcting a read-out pattern in the case in which a pattern to be checked is continuously moved in a Y-direction while scanning a one-dimensional line sensor in an X-direction. However, in order to correct a deviation between the pattern to be checked and the master pattern, there has been an unsolved problem in that it is impossible to control the inclination of the one-dimensional line sensor unless a deviation angle between the pattern to be checked and the master pattern is detected separately.

SUMMARY OF THE INVENTION

The present invention was made in view of the unsolved problems in the prior art mentioned above, and it is a first object of the invention to provide a method and apparatus for pattern checking which is capable of solving the above-mentioned problems without providing any particular position registering mark, by reading the pattern to be checked in this condition while scanning in an X-direction and a Y-direction, and by correcting an angular error at the time of image processing.

A second object of the present invention is to provide a method and apparatus for pattern checking which enables a defect recognition accuracy which differs depending on a pattern portion, and which satisfies both requirements of correctness and a reduction of the number of rechecking members.

It is a third object of the invention to provide a method and apparatus for pattern checking which is capable of solving the above-mentioned problems without providing any particular position registering mark, even when a pattern to be checked is angularly deviated, by reading the pattern to be checked in this condition while scanning in an X-direction and a Y-direction, and by correcting an angular error at the time of image processing, and furthermore, which enables a defect recognition accuracy to be set which varies depending on a pattern portion, and which satisfies both requirements of correctness and a reduction of the number of rechecking members.

In order to solve the above problems, in accordance with a first aspect of the invention, in a method for checking a pattern wherein an object under check having a pattern to be checked formed thereon is scanned one-dimensionally or two-dimensionally relative to an imaging device to obtain check pattern data, and the check pattern data is compared with previously stored master pattern data to check a defect in the pattern to be checked, the improvement comprises the following steps of: dividing the check pattern data for each one scanning line from the imaging device into a plurality of pixel groups and storing the check pattern data; calculating an inclination of the pattern to be checked by comparing the stored check pattern data with the master pattern data; matching the check pattern data and the master pattern data with the inclination of the pattern to be checked; and comparing the check pattern data with the master pattern data.

In accordance with a second aspect of the invention, in an apparatus for checking a pattern wherein an object under check having a pattern to be checked formed thereon .is scanned one-dimensionally or two-dimensionally relative to an imaging device to obtain check pattern data, and the check pattern data is compared with previously stored master pattern data to check a defect in the pattern to be checked, the improvement comprises: means for dividing the check pattern data for each one scanning line from the imaging device into a plurality of pixel groups and for storing the check pattern data; means for detecting an inclination of the pattern to be checked by comparing the stored check pattern data with master pattern data; and means for matching the check pattern data and the master pattern data with each other by changing the order of reading of either the check pattern data or the master pattern data in accordance with a detected result of the inclination detection means.

In accordance with a third aspect of the invention, in a method for checking a pattern wherein an object under check having a pattern to be checked is scanned one-dimensionally or two-dimensionally relative to an imaging device to obtain check pattern data, and the check pattern data is compared with previously stored master pattern data to check a defect in the pattern to be checked, the improvement comprises the following steps of: forming a deviation allowing pattern data which is set to a desired deviation quantity corresponding to a pattern portion of low importance with respect to a defect recognition accuracy in the master pattern data; forming comparison master pattern data based on the deviation allowing pattern data and the master pattern data; forming contour data of the comparison master pattern data; extracting a defective portion by comparing the comparison pattern data with the check pattern data; and judging the absence or presence of a defect in the pattern to be checked by masking the extracted defective portion with the contour data.

In accordance with a fourth aspect of the invention, in an apparatus for checking a pattern wherein an object under check having a pattern to be checked formed thereon is scanned one-dimensionally or two-dimensionally relative to an imaging device to obtain check pattern data, and the check pattern data is compared with previously stored master pattern data to check a defect in the pattern to be checked, the improvement comprises: means for forming a deviation allowing pattern which is set to a desired deviation quantity corresponding to a pattern portion which is of low importance with respect to a defect recognition accuracy in the master pattern data; means for forming comparison master pattern data based on the deviation allowing pattern data and the master pattern data; means for extracting a defective portion by comparing the comparison master pattern data with the check pattern data; and means for masking the extracted defective portion with the contour pattern data.

In accordance with a fifth aspect of the invention, in a method for checking a pattern wherein an object under check having a pattern to be checked is scanned one-dimensionally or two-dimensionally relative to an imaging device to obtain a check pattern data, and the check pattern data is compared with previously stored master pattern data to check a defect of the pattern to be checked, the improvement comprises the steps of: dividing check pattern data for each one scanning line from the imaging device into a plurality or pixel groups and storing the check pattern data; calculating an inclination of the pattern to be checked by comparing the store check pattern data with the master pattern data with each other by changing the order of reading of either the check pattern data or the master pattern data in accordance with the inclination of the pattern to be checked; forming a deviation allowing pattern which is set to a desired deviation quantity corresponding to a pattern portion which is of low importance with respect to a defect recognition accuracy in the master pattern data; forming comparison master pattern data based on the deviation allowing pattern data and the master pattern data; forming contour data of the comparison master pattern data; extracting a defective portion by comparing the comparison pattern data with the check pattern data; and judging the absence or presence by masking the extracted defective portion with the contour data. In this case, it is preferable to take the exclusive OR of the check pattern data and the master pattern data.

In accordance with a sixth aspect of the invention, in an apparatus for checking a pattern wherein an object under check having a pattern to be checked is scanned one-dimensionally or two-dimensionally relative to an imaging device to obtain a check pattern data, and the check pattern data is compared with previously stored master pattern data to check a defect of the pattern to be checked, the improvement comprises: means for dividing check pattern data for each one scanning line from the imaging device into a plurality of pixel groups and for storing the check pattern data; means for detecting an inclination of the check pattern by comparing the stored check pattern data with the master pattern data;

means for matching the check pattern data and the master pattern data with each other by changing the order of reading of either the check pattern data or the master pattern data in accordance with a check result of the inclination detection means; means for forming a deviation allowing pattern which is set to a desired deviation quantity corresponding to a pattern portion which is of low importance with respect to a defect recognition accuracy in the master pattern; means for forming a deviation allowing pattern which is set to a desired deviation quantity corresponding to a pattern portion which is of low importance with respect to a defect recognition accuracy in the master pattern; means for forming comparison master pattern data based on the deviation allowing pattern data and the master pattern data; means for forming contour pattern data of the comparison master pattern data; means for extracting a defective portion by comparing the comparison master pattern data with the check pattern data. Here, it is preferable that the comparing means extracts the defective portion by taking the exclusive OR of the check pattern data and the master pattern data.

In the method and apparatus for checking a pattern in the first and second aspects of the invention, check pattern data for one scanning obtained by scanning an object to be checked is divided into a plurality of pixel groups and stored. An inclination error between the check pattern data and the master pattern data is detected by comparing both the pattern data. Matching between the check pattern data and the master pattern data is insured by changing the order of reading of either the check pattern data or the master pattern data is insured by changing the order of reading of either the check pattern data or the master pattern data in accordance with the inclination error. As a result, it is possible to correct the inclination error without providing any particular position registering mark and reading means therefore.

Furthermore, in the method and apparatus for checking a pattern in the third and fourth aspects of the invention, deviation allowing pattern data which can be set to a desired deviation quantity corresponding to a pattern portion having a low defect recognition accuracy in the master pattern data used as a standard is formed. Comparison master pattern data having a desired allowable range as to a pattern portion which is of low importance in a defect recognition accuracy is formed based on the deviation allowing pattern data. The master pattern data, and contour data pattern of the comparison master pattern data is also formed. As a result, this contour pattern data corresponds to a pattern contour portion whose accuracy cannot but be substantially lowered and to a pattern portion of a low defect recognition accuracy. Then a defective portion is extracted by comparing the comparison master pattern data with the pattern data of the object under check, and the defect judgement can be performed with different standards for pattern portions whose defect recognition accuracy is different from one to another by masking the extracted defect data with the contour pattern data. As a result, the throughput of the defect checking can be improved by reducing the number of rechecking members while maintaining the defect detection accuracy at a high level.

Furthermore, in the method and apparatus for checking a pattern in the fifth and sixth aspect of the invention, the advantages of the first and second aspects and the advantages of the third and fourth aspects are provided in which, since the defect judgement is carried out in a condition wherein the check pattern data and the master pattern data have been matched with each other with high accuracy, the defect detection can be achieved more accurately and, at the same time, the overall throughput can be improved by decreasing the number of rechecking members.

DESCRIPTION OF THE PREFERRED EMBODIMENT

Figure 1:
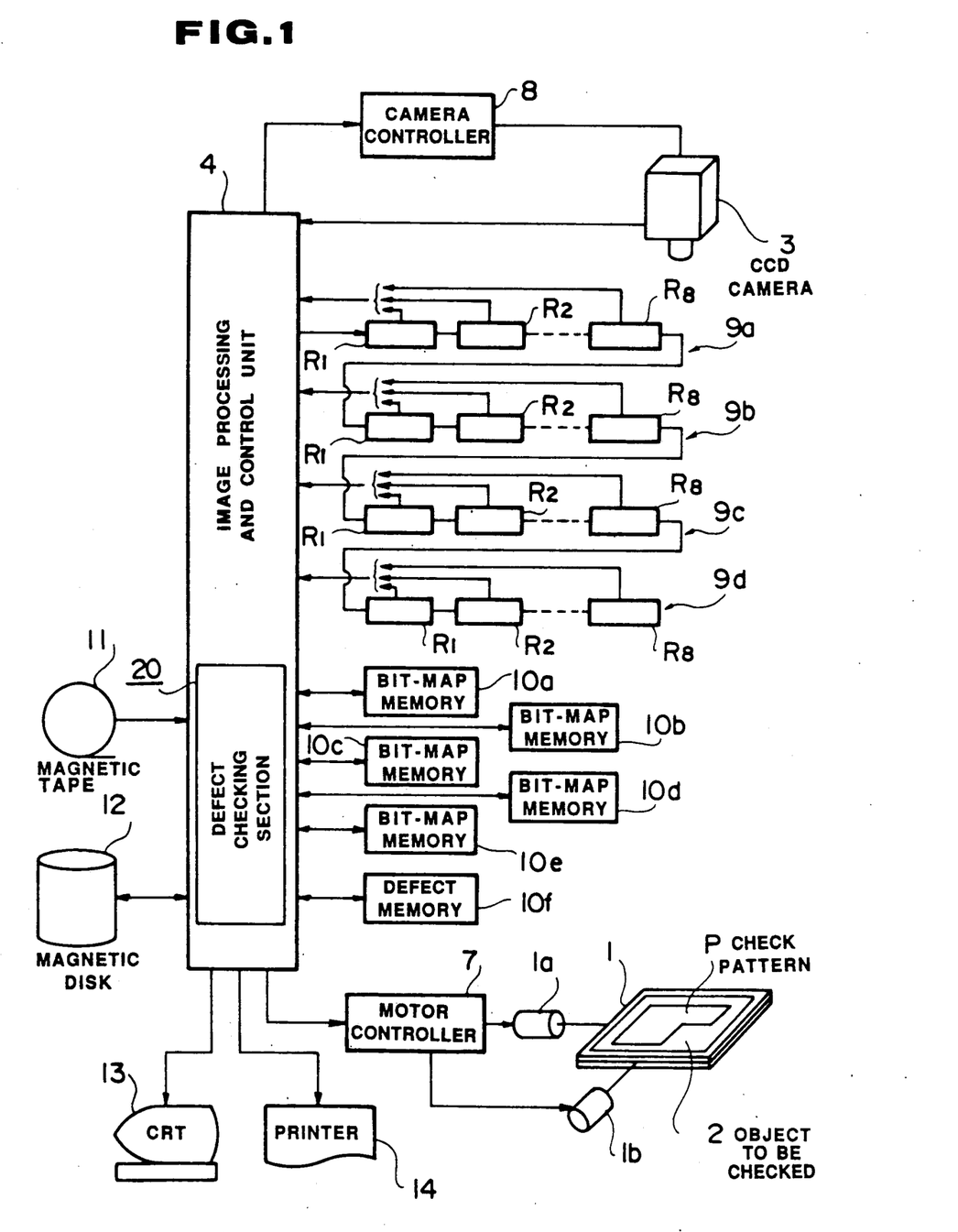
FIG. 1 is a block diagram showing an embodiment of the present invention.

With reference to FIG. 1 which shows a block diagram of an embodiment of the invention, reference number 1 designates a support table movable at least in X and Y directions and carrying thereon and object 2 to be checked, such as a mask, a reticle, a printed substrate, or the like which has a check pattern (a pattern to be checked) P formed on a surface thereof. The support table 1 is driven in the X and Y directions by an X-axis driving motor 1a and a Y-axis driving motor 1b.

A CCD camera 3 serving as an imaging device is fixedly disposed above the upper surface of the support table 1 opposing the object 2 to be checked. The CCD camera 3 picks up the check pattern P of the object 2 under check and outputs image data.

The support table 1 and the CCD camera 3 are controlled by an image processing and control unit 4 which may comprise, for example, a computer. The image data from the CCD camera 3 is processed by the image processing and control unit 4.

Figure 6:
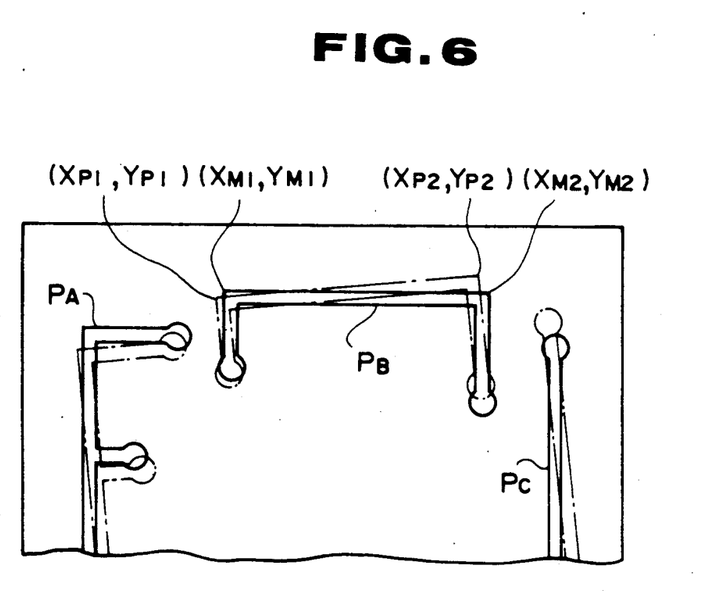
FIG. 6 is a diagram for use in explaining a master pattern.
Figure 7:
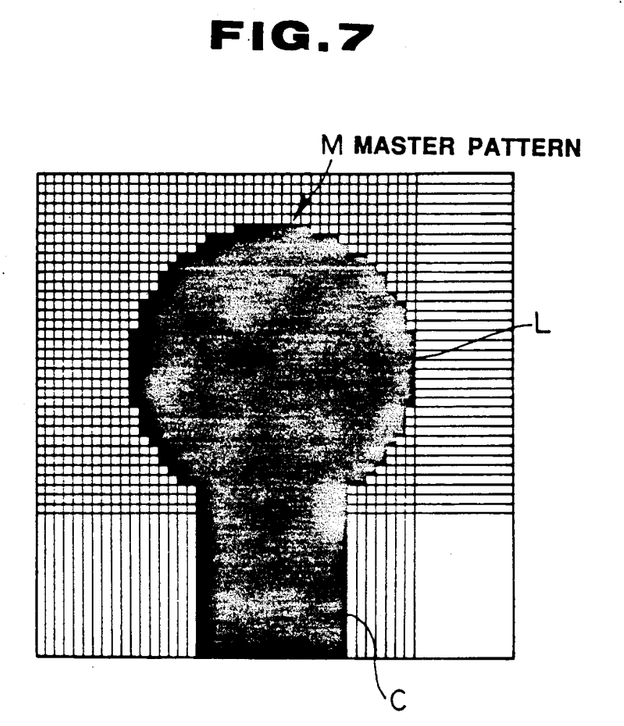
FIG. 7 is a partially enlarged view of the master pattern shown in FIG. 6.

The image processing and control unit 4 is connected to a motor controller 7 for controlling the X-axis motor 1a and Y-axis motor 1b, a camera controller 8 for controlling the CCD camera 3, shift register groups 9a and 9d each including a plurality of groups, for example four groups connected in series, each group including eight shift registers R1 and R8 for storing by dividing one scanning line of the image data from the CCD camera 3 into eight parts. The image processing and control unit 4 is further connected to five bit-map memories 10a and 10e and a defect data memory 10f as image memories, to a magnetic tape device 11, to a magnetic disk device 12, to a CRT display 13, and to a printer 14. The magnetic tape device 11 has mounted thereon a magnetic tape which records input data (hereinafter referred to as CAD data) to be supplied to a photo-plotter, a pattern generator, etc., from a CAD device used in designing the check pattern P formed on the object 2 under check, such as a printed substrate or the like. The CAD data, assuming that a master pattern M includes a land L to be formed on the printed substrate and a conductor C connected to the land L as shown in FIGS. 6 and 7, includes vector data representing positional coordinates and a direction of the land L and the conductor C in a compressed form.

The image processing and control unit 4 executes a predetermined processing sequence in accordance with a program stored in a ROM built therein and first, stores image data for four scanning lines outputting from the CCD camera 3 in the shift register groups 9a as a sequential buffer memory, calculates edge coordinates (XP1, YP1) and (XP2, YP2) in a lateral direction of a predetermined pattern set beforehand from the stored image data, calculates an inclination $\tan \theta$ of the check pattern P with respect to the master pattern M based on the edge coordinates (XP1, YP1) and (XP2, YP2), and the edge coordinates (XM1, YM1) and (XM2, YM2) of an identical pattern of the master pattern, performs a coordinate transformation by deciding the read-out address order for each shift register R1 to R8 of the shift register groups 9a to 9d based on the inclination $\tan \theta$, reads out the image data stored in the shift register groups 9a to 9d in accordance with this read-out address order, and stores check pattern read-out data in the bit-map memory 10a. A deviation of the CCD camera 3 in the line direction due to the inclination of the check pattern P is corrected by moving the support table 1 in the line direction by a predetermined amount set beforehand in accordance with the inclination.

Furthermore, the image processing and control unit 4 calculates coordinate data (numerical data of x and y coordinates of edges) representing an external shape of the master pattern M based on the CCD data, and stores such coordinate data in the magnetic disk device 12 as master pattern data.

Figure 2:
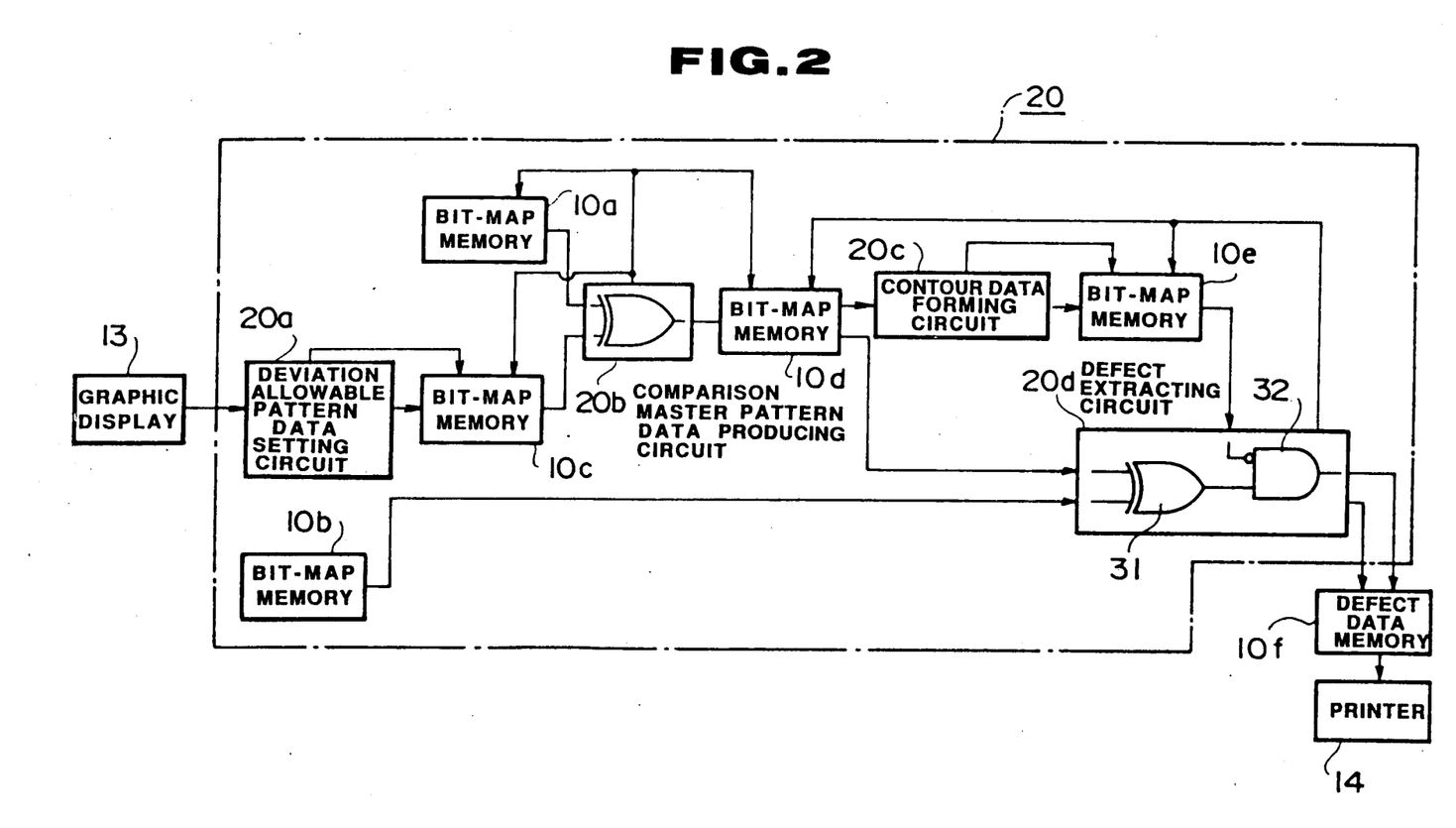
FIG. 2 is a block diagram showing an example of the defect checking section in the image processing and control unit shown in FIG. 1.
Figure 8:
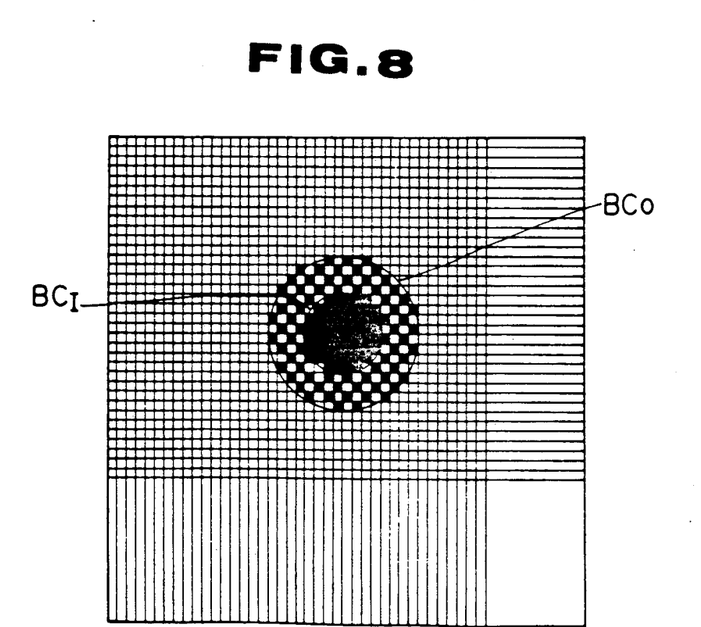
FIG. 8 is a diagram for use in explaining a deviation allowing pattern.
Figure 9:
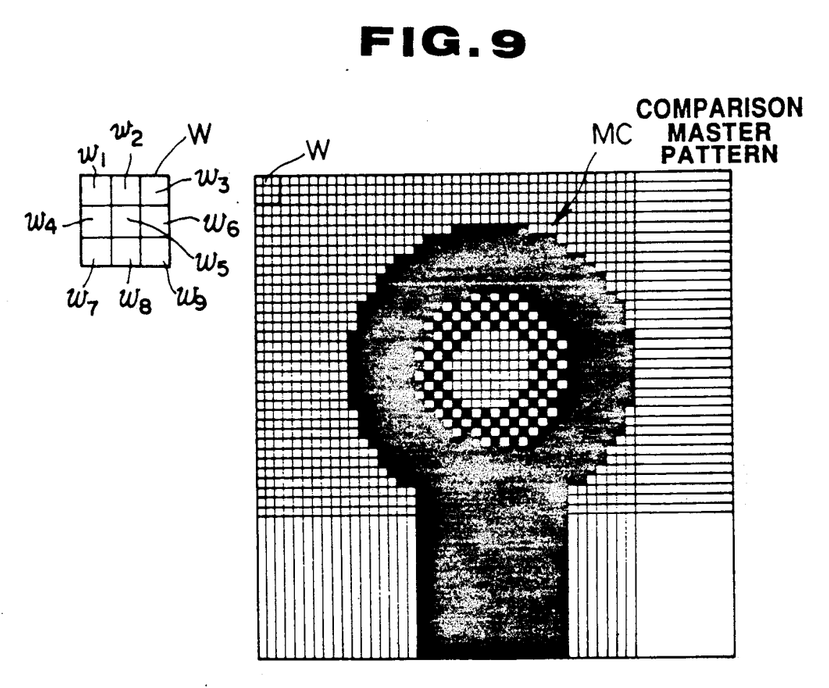
FIG. 9 is a diagram for use in explaining a comparison master pattern.

Moreover, the image processing and control unit 4 is provided with a defect checking section 20 as shown in FIG. 2. The defect checking section 20 includes a deviation allowing pattern data setting circuit 20a for setting deviation allowing pattern data as shown in FIG. 8 for a pattern whose defect recognition accuracy is low in the CAD data, a comparison master pattern data producing circuit 20b for producing master pattern data for comparison as shown in FIG. 9 based on the deviation allowing pattern data and the master pattern data stored in the bit-map memory 10a, a contour data forming circuit 20c for converting the comparison master pattern data into contour pattern data by using a window having a predetermined size, and a defect extraction circuit 20d. The defect extraction circuit 20d extracts a defect by comparing the comparison master pattern data produced in the comparison master pattern data producing circuit 20a with the check pattern data stored in the bit-map memory 10b, and forms true defect data by masking the extracted defect data with the contour data from the contour data producing circuit 20c and, further, stores the defect data in a defect data memory 10f. The defect data stored in the defect data memory 10f is outputted to a graphic display or CRT 13 and the printer 14 as required.

The allowable pattern data setting circuit 20a forms allowable pattern data by using the graphic display 13 for a pattern portion whose defect recognition accuracy is low in which, although roughness remains at a peripheral portion due to poor positional accuracy or burring, the influence of the roughness does not result in a serious defect. For example, allowable pattern data as shown in FIG. 8 is formed in accordance with a deviation allowable quantity of a through hole T bored in a printed substrate by punching or drilling. First, center coordinates of a normal through hole T and a diameter smaller than a diameter of the through hole T according to the deviation allowable quantity are inputted, and an inner deviation boundary circle BC1 having a small diameter is formed. The inside of the boundary circle BC1 is painted out with black, and an outer deviation boundary circle BC0 having a larger diameter corresponding to the deviation allowable quantity is formed concentrically with respect to the boundary circle BC1. An intermediate portion between the outer deviation boundary circle BC0 and the inner deviation boundary circle BC1 is half-tone screened, for example, in a checker pattern to form a deviation pattern data defining each dot contained therein. This deviation allowable pattern data is stored in the bit-map memory 10c.

The comparison master pattern producing circuit 20b performs the same addressing to the master pattern data stored in the bit-map memory 10a and to the deviation allowable pattern data stored in the bit-map memory 10c, and reads out bit by bit in a predetermined order. The comparison master pattern data is formed by taking the exclusive OR of both data, and the result thereof is stored at the same address in the bit-map memory 10d.

Figure 3:
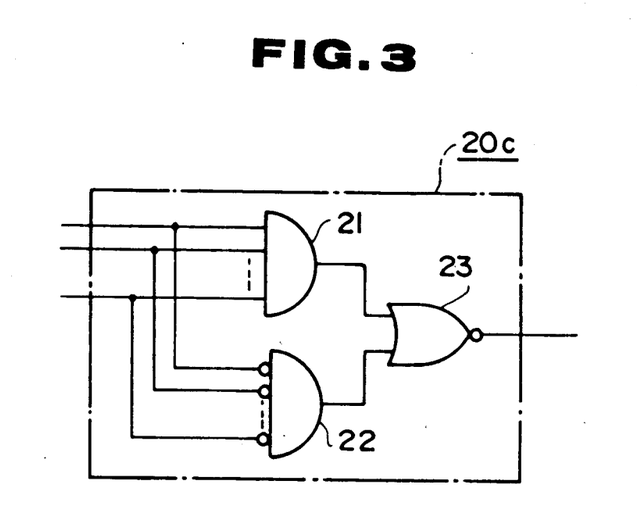
FIG. 3 is a circuit diagram showing an example of the contour pattern data forming circuit shown in FIG. 2.

The contour data forming circuit 20c reads out the comparison master pattern data stored in the bit-map memory 10d every nine bits by addressing in correspondence to a square window W of 3×3 bits. Each bit signal is inputted to an AND circuit 21 of positive logic and to an AND circuit 22 of negative logic as shown in FIG. 3. The outputs of both the AND circuits 21 and 22 are supplied to a NOR circuit 23. The NOR circuit 23 outputs a logical value of "0" for a bit position corresponding to a center pixel w5 of the window W when all bits of the window W are "1" or "0" and are mixedly present in the bits of the window W, so that the contour data is formed. The contour data is sequentially stored in the bit-map memory 10e at an address corresponding to the current address of the center pixel w5.

The defect extracting circuit 20d sequentially reads out the check pattern data stored in the bit-map memory 10b, the comparison master pattern data stored in the bit-map memory 10d, and the contour data stored in the bit-map memory 10e bit by bit by addressing. The comparison master pattern data and the check pattern data thus read are supplied to an exclusive OR circuit 31 to take the "exclusive or" thereby to form the defect data which assumes a logical value of "1" for a defective pattern portion. The defect data and inverted data of the contour data are supplied to an AND circuit 32 to take the "and condition" thereby to obtain true defect data which is masked with the contour data. An address at this time is stored as defect data in the defect data memory 10f.

Figure 4:
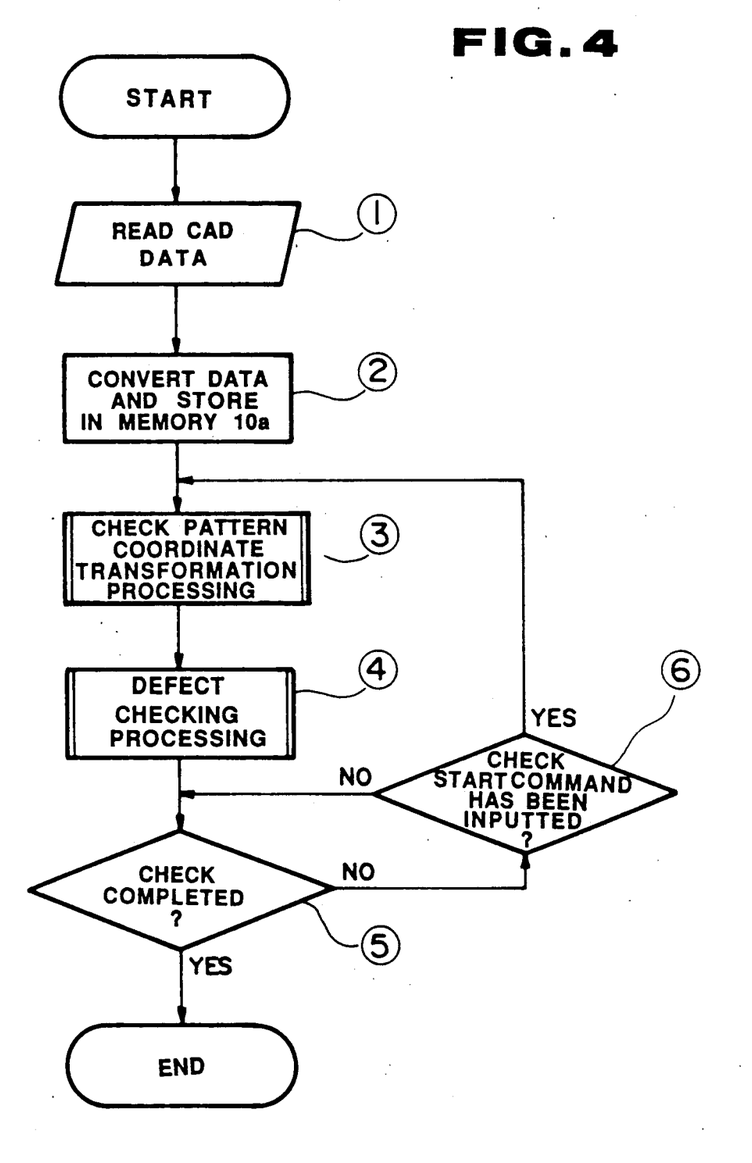
FIG. 4 is a flowchart showing a processing procedure performed in the control unit shown in FIG. 1.
Figure 5:
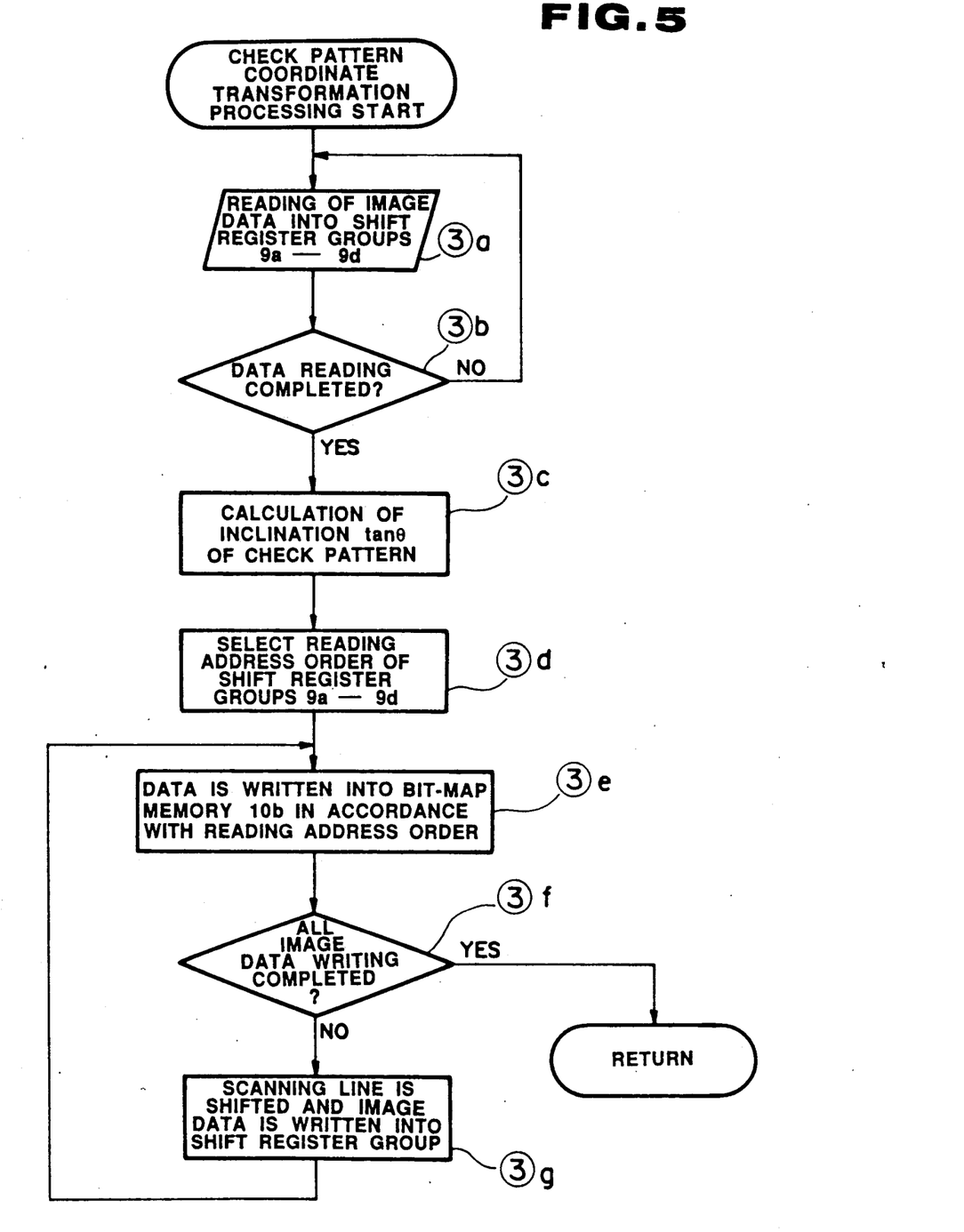
FIG. 5 is a flowchart showing a check pattern coordinate transformation processing procedure performed in the control unit shown in FIG. 1.

Next, the operation of the above-mentioned embodiment will be described with reference to the flowcharts depicted in FIGS. 4 and 5 illustrating a pattern matching processing procedure of the image processing and control unit 4.

A shown in FIG. 4, in step (1) the magnetic tape device 11 is driven to read the CAD data of the master pattern M, and in step (2) the CAD data is expanded and converted to master pattern data corresponding to dots, and the resultant data is stored in the bit-map memory 10a.

Successively, in step (3) the image data from the CCD camera 3 is read, and a check pattern coordinate transformation processing is performed based on the image data in which when the check pattern is inclined with respect to the master pattern, the inclination is corrected and the result is registered in the bit-map memory 10b.

Then, proceeding to step (4), a defect checking processing is performed based on the master pattern data stored in the bit-map memory 10a and the check pattern data stored in the bit-map memory 10b.

Proceeding to the step (5), it is decided whether to terminate the check or not, and when the check is to be continued, flow proceeds to step (6) to decide whether a check start command for starting the next check has been inputted or not. When the check start command has not been inputted, flow waits as it is, whereas when the check start command has been inputted, flow returns to step (3). When the check is to be terminated, the processing is terminated.

Specifically, in the check pattern coordinate transformation processing in the step (3), as shown in FIG. 5, in step (3)a, the first four scanning lines of check pattern read-out data outputted from the CCD camera 3 is written in the shift register groups 9a and 9d. The writing of the data into the shift register groups 9a and 9d is carried out in such a manner that, since the shift register groups 9a and 9d are connected in series, when the data outputted time-sequentially from the CCD camera 3 is sequentially written into the shift register R1 of the shift register group 9a, the first written data is sequentially shifted and written into the last stage shift register R8 of the shift register group 9d.

Then proceeding to step (3)b, it is decided whether the writing of the read-out data into the shift register groups 9a and 9d is completed or not, and when the writing is not completed, flow returns to the step (3)a to continue the writing processing of the read-out data. When the writing is completed, flow proceeds to step (3)c.

In this step (3)c, the check pattern read-out data written into the shift register groups 9a to 9d is retrieved, and two edge coordinates (XP1, YP1), and (XP2, YP2) of a check pattern PB shown by a phantom line in FIG. 6 are calculated. Based on these edge coordinates and edge coordinates (XM1, YM1) and (XM2, YM2) of a master pattern M shown by a solid line shown in FIG. 6, an inclination tan $\theta$ of the check pattern P with respect to the master pattern M is calculated. In calculating the inclination tan $\theta$, first, one of the edge coordinates (XP1, YP1) and (XM1, YM1) of each of the check pattern P and the master pattern M are taken, and a deviation $\Delta X$ in the X-direction, and a deviation $\Delta Y$ in the Y-direction are calculated in accordance with the following formulas (1) and (2). Then, the inclination tan O is calculated from the following formula (3) based on both of the deviations.

$$\Delta X = |XP1 - XM1| \quad (1)$$

$$\Delta X = |P1 - YM1| \quad (2)$$

$$\tan O = \Delta x / \Delta y \quad (3)$$

Similarly, he calculation is performed as to the other of each of the edge coordinates, and an inclination tan $\theta$2 is obtained. The inclination tan $\theta$1 and tan $\theta$2, or when both the inclinations are equal to each other, the inclination tan $\theta$ is determined by either one of the two inclination. In the case in which the check pattern P is inclined and centered about either of the edge coordinates, the inclination becomes zero as to the edge coordinates which are the center, and the inclination tan $\theta$ corresponding to inclination of the pattern is obtained as to the other coordinates. Thus, this inclination tan $\theta$ is determined as the inclination of the check pattern.

Subsequently, in step (3)d, FIG. 5, by reference to a memory table showing a correspondence relationship between the inclination tan $\theta$ and a read-out address, selects the order of read-out address in the shift register groups 9a and 9d (for example, shift registers R8, R7 of the shift register group 9d, shift registers R6, R5 of the shift register group 9c, R4, R3 of the shift register group 9b, and shift registers R2, R1 of the shift register group 9a). In this case, as the inclination tan $\theta$ becomes small, the read-out of the data stored is not performed in the order of the shift registers 9a, 9b, 9c and, when the inclination tan $\theta$ is zero, only the stored data of the shift register 9d is read out.

Then, proceeding to step (3)e, in accordance with the address read-out order selected in the step (3)d, the written data is read out from each of the shift registers R1 to R8 of the shift register groups 9a to 9d, and the read data is sequentially stored in the bit-map memory 10b.

Subsequently, in step (3)f, it is decided whether the writing of the entire image data into the bit-map memory 10b has been completed or not. If the writing is not complete, flow proceeds to step (3)g and, after storing image data for subsequent four scanning lines from the CCD camera 3 in the shift register groups 9a to 9d, flow returns to the step (3)e. However, if the writing of the image data has been completed, the processing is completed and flow proceeds to step (4) in FIG. 4.

By this check pattern coordinate transformation processing, a read-out position of each of the shift registers R1 to R8 of the shift register groups 9a to 9d is changed in accordance with the inclination of the check pattern P with respect to the master pattern M. As a result, the check pattern data stored in the bit-map memory 10b now matches the master pattern data stored in the bit-map memory 10a with its inclination corrected.

In a defect check processing in step (4), FIG. 4 in the deviation allowable pattern forming circuit 20a, the inner deviation boundary circle BC1 is formed by using the graphic display 13 and by inputting the center coordinates of each land L having a low defect recognition accuracy and inputting a diameter corresponding to the deviation allowable quantity of the printed substrate in the CAD data. The inside of this inner deviation boundary circle BC1 is painted out with black color. Subsequently, an outer deviation circle BC0 is formed by inputting a diameter corresponding to the deviation quantity concentrically about the inner deviation boundary circle BC1. The area between both the boundary circles is applied with a half-tone screen in a checker pattern including individual dots to thereby form the deviation allowable data shown in FIG. 8. The deviation allowable data is then stored in the bit-memory 10c.

In this condition, in the comparison master pattern data producing circuit 20b, the master pattern data and the deviation allowable data stored respectively in the bit-map memories 10a and 10c are read out sequentially in a predetermined order, and the area between the inner deviation boundary circle BC1 and the outer deviation boundary circle BC0 is represented by a checker pattern which is an inversion of the checker pattern of the deviation allowable data. Pattern data outside the inverted checker pattern is black. The comparison pattern data consisting of individual dots of the comparison master pattern MC is stored in the bit-map memory 10d.

Figure 10:
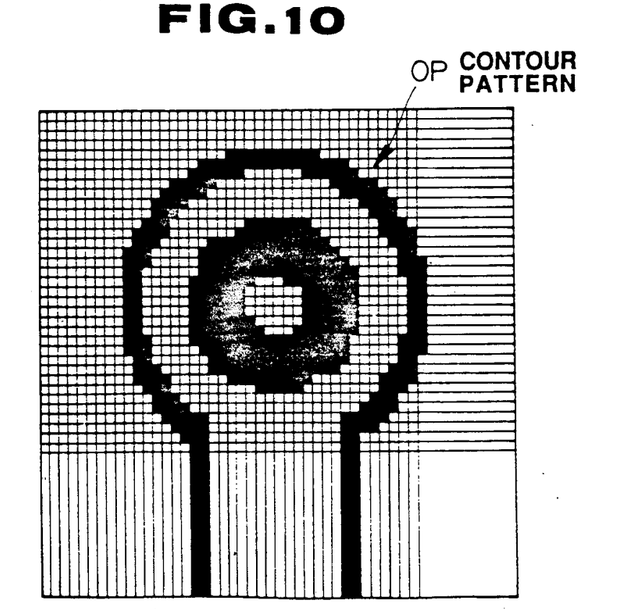
FIG. 10 is a diagram for use in explaining a contour of the comparison master pattern.

Furthermore, in the contour data forming circuit 20c, the comparison master pattern data stored in the bit-memory 10d is sequentially read by using the window W of 3×3 bits, that is a total of nine bits. By taking the "and" condition of positive logic and negative logic of each bit signal, and then by taking the "nor" condition, the contour data is formed. Specifically, in FIG. 9, when each of the pixels w1 to w9 assumes a logical value of "0", and the output of the AND circuit 21 is "0", the output of the AND circuit 22 is "1", and the output of the NOR circuit 23 is a logical value of "0" representing white color. This result is written at a current address position of the center pixel w5 of the window W. Conversely, when all the pixels w1 to w9 are overlapped with the land L or conductor C, the bit of each of the pixels w1 to w9 assumes a logical value of "1", the output of the AND circuit 22 is "0", and the output of the NOR circuit 23 is a logical value of "0" representing white color. This result is written at a current address position of the center pixel w5 of the winder W in the bit-map memory 10e. On the other hand, when a part of the pixels w1 to w9 of the window W is overlapped with the checker pattern, since both outputs of the AND circuits 21 and 22 assume a logical value of "0", the output of the NOR circuit 23 assumes a logical value of "1" representing black color. This result is written at an address position of the center pixel w5 in the bit-map memory 10e. As a result, as shown in FIG. 10, a contour pattern OP is formed in which an outer contour portion of the comparison master pattern MC of FIG. 9 and the inner checker pattern of FIG. 9 are represented by black color. Contour pattern data consisting of individual dots of this contour pattern OP is stored in the bit-map memory 10e as master data.

Figure 11:
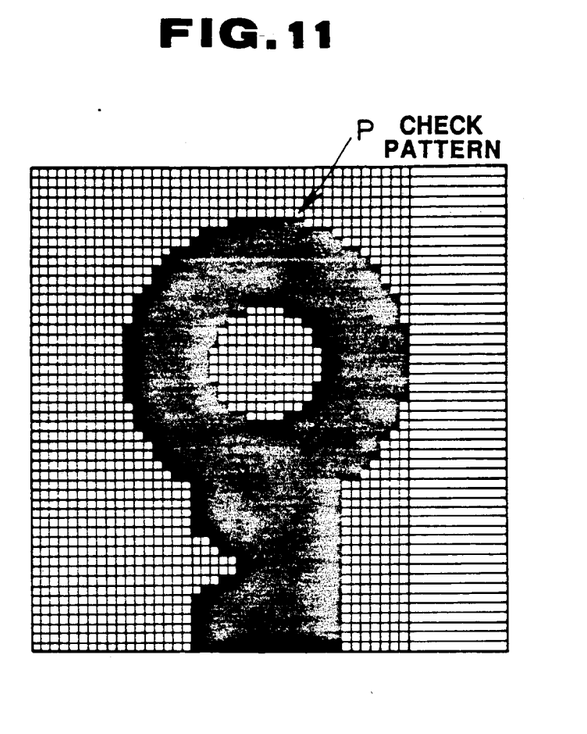
FIG. 11 is a diagram for use in explaining a check pattern.
Figure 12:
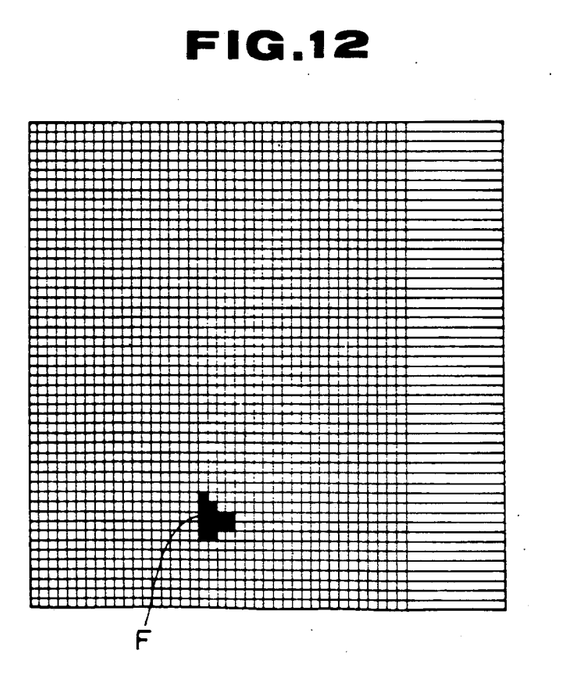
FIG. 12 is a diagram for use in explaining a defective pattern.

Under the condition in which the comparison master pattern data is stored in the bit-map memory 10d and the contour data is stored in the bit-map memory 10e, when the check of the check pattern P of the object 2 to be checked is to be performed, the check pattern data corrected with respect of the deviation as shown in FIG. 11 and the comparison master pattern data stored in the bit-map memory 10d and the contour data stored in the bit-map memory 10e are sequentially read out by the same addressing, and among these data, the comparison master pattern data and the check pattern data are supplied to the input terminals of the exclusive OR circuit 31. As a result, the exclusive OR circuit 31 outputs a logical value of "0" when the comparison master pattern data and the check pattern data are coincident with each other, whereas the exclusive OR circuit outputs defect detection data having a logical value of "1" when both data are not coincident. This defect detection data is inputted to a non-inverting input terminal of the AND circuit 32, and an inverting input terminal of this AND circuit 32 is supplied with the contour data read out from the bit-map memory 10e. As a result, the defect detection data corresponding to the contour data is masked, and as shown in FIG. 12, only a defective portion F is extracted at dot positions excepting a contour portion of the comparison master pattern data by the AND circuit 32. An address at this time is stored in the defect data memory 10f as defect coordinates.

In this case, in the contour data, a range of the position of the through hole T having relatively low defect recognition accuracy is set widely as compared with a range of the outer contour portion of the land L and the conductor C having relatively high defect recognition accuracy. As a result, the defect detection data corresponding to the contour data is masked, and as shown in FIG. 12, only a defective portion F is extracted at dot positions excepting a contour portion of the comparison master pattern data and the AND circuit 32. An address at this time is stored in the defect data memory 10f as defect coordinates.

In this case, in the contour data, a range of the position of the through hole % having relatively low defect recognition accuracy is set widely as compared with a range of the outer contour portion of the land L and the conductor C having a relatively high defect recognition accuracy. As a result, the defect recognition can be achieved with high accuracy for the land L and the conductor C. On the other hand, as regards the through hole T which is formed in the check pattern P to be checked, even when a positional deviation is caused with respect to the standard position, if the positional deviation is within the checker pattern in the defect allowable data, such a deviation is not recognized as a defective pattern, and thus, the defect detection data to be stored in the defect data memory 10f is decreased by the amount of this unrecognized data. Only the true defect detection data is stored in the defect data memory 10f. Furthermore, the defect allowable quantity can be set to an arbitrary range in the deviation allowable pattern formation circuit 20a.

Moreover, in the contour pattern data forming circuit 20c, since the defect checking is performed by using the window of 3×3 bits, even when a quantizing error, a positional deviation, or a roughness in the pattern formation is caused amounting to ±1 bit in the master pattern M and the check pattern P, it is possible to judge such as not being a defect and to prevent erroneous detection.

In the embodiment described above, although the matching of the check pattern and the master pattern is obtained by changing the read-out order of the check pattern data, the present invention is not limited to this, and the read-out order of the master pattern data may be changed.

Furthermore, in the above embodiment, although the inclination is calculated based on the edge coordinates of both ends of the pattern, in a printed substrate or the like, the inclination may be calculated based on the position coordinates of a minute pattern of a predetermined through hole or the like.

Moreover, in the above embodiment, although the CCD camera 3 is used as an imaging device, the present invention is not limited to this, and a combination of an image sensor of the line scan type with a support table movable in synchronism with the image sensor may be used.

In the above embodiment, although the checker pattern is formed in the deviation allowable pattern setting circuit 20a, the present invention is not limited to this, and any pattern may be used if it becomes black when the color pattern data is formed.

Figure 13A:
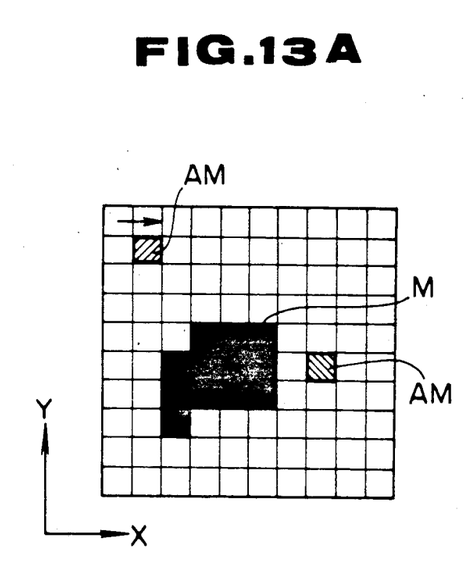
FIG. 13A and 13B are diagrams for use in explaining other embodiments of the present invention.
Figure 13B:
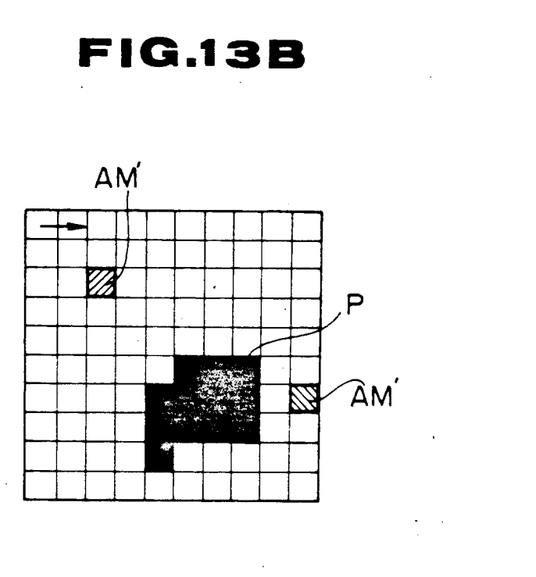

Generally, as shown in FIG. 13A, the CAD data for forming a pattern includes a plurality of alignment marks AM for positioning the object 2 to be checked on the support table 1. Thus, the coordinates of the alignment mark AM may be compared with the coordinates of the alignment marks AM' contained in the read-out data of the object 2 to be checked as shown in FIG. 13B to thereby calculate a deviation quantity between both of the alignment marks. Accordingly, the window W may be selected to a size of a minimum number of pixels by correcting the deviation quantity, by moving the support table 1, or by solving by correction of the coordinates of the bit-map memory 10d.

Furthermore, in the above embodiment, the input data to the photoplotter or the pattern generator is used as a CAD data. However, the present invention is not limited to this, and any graphic data which permits an external shape of a pattern to be taken out may be used. Moreover, any arbitrary recording medium, such as a floppy disk network or the like, other than a magnetic tape may be used as a data recording medium.

As described in the foregoing, in the method and apparatus for checking a pattern in accordance with the first and second aspect of the present invention, the check pattern data for each one scan line from the imaging device is divided into a plurality of pixel groups and stored, and an inclination of the check pattern, and thereafter, both of the patterns are compared with each other to perform the defect checking. As a result, an erroneous judgement as being a defective pattern due to an angular deviation between the check pattern and the master pattern can be avoided without fail.

Furthermore, in the method and apparatus for checking a pattern in accordance with the third and fourth aspect of the present invention, comparison master pattern data is formed based on master pattern data which is a standard for defect checking and on deviation allowable data which is set as to a pattern portion having a low defect recognition accuracy in the master pattern. Further, contour data of the comparison master comparing the comparison master pattern data with the check pattern of the object to be checked, and the defect data is masked. As a result, it is possible to extract only the true defect data excluding unnecessary defect data. Owing to this, an advantage is provided in which the capacity of a memory for defect data can be decreased, and unnecessary rechecking is avoided while maintaining the defect recognition accuracy at a high level to thereby reduce labor and time for visual judgement and to improve the throughput of the defect checking.

Moreover, in a method and apparatus for checking a pattern in accordance with the fifth and sixth aspects of the present invention, the defect checking according to the third and fourth aspects is performed after the matching between the check pattern data and the master pattern data is insured. Owing to this, a further accurate pattern checking with reduced number of rechecking members can be achieved, and the throughput of the overall pattern checking can be improved.

In addition, by taking the exclusive OR of the check pattern and the comparison pattern, an accurate pattern checking can be attained even when a certain deviation is caused between the coordinates of both the pattern data.

What is claimed is:

1. In a method for checking a pattern wherein an object under check having a pattern to be checked formed thereon is scanned two-dimensionally relative to an imaging device to obtain check pattern data, and the check pattern data is compared with previously stored master pattern data to check for a defect in the pattern to be checked, the improvement comprising the steps of: dividing check pattern data for each one scanning line from the imaging device into a plurality of pixel groups and storing the check pattern data in a memory means; calculating an inclination of the pattern to be checked by comparing the store check pattern data with the master pattern data; matching the check pattern data and the master pattern data with each other by changing the order of reading of one of the check pattern data and the master pattern data in accordance with the inclination of the pattern data to be checked; and comparing the check pattern data with the master pattern data.

2. The improvement in a method for checking a pattern according to claim 1 wherein the comparison between the comparison pattern data or the master pattern data and the check pattern data is performed by taking the exclusive OR of the check pattern data and the master pattern data.

3. In an apparatus for checking a pattern wherein an object under check having a pattern to be checked formed thereon is scanned two-dimensionally relative to an imaging device to obtain check pattern data, and the check pattern data is compared with previously stored master pattern data to check for a defect in the pattern to be checked, the improvement comprising: means for dividing the check pattern data for each one scanning line from the imaging device into a plurality of pixel groups and for storing the check pattern data in a memory means; means for detecting an inclination of the pattern to be checked by comparing the stored check pattern data with the master pattern data; means for matching the check pattern data and the master pattern data with each other by changing the order of reading of one of the check pattern data and the master pattern data in accordance with a detected result of the inclination detection means; and means for comparing the check pattern data with the master pattern data.

4. The improvement in an apparatus for checking a pattern according to claim 3 wherein the means for extracting a defective portion extracts the defective portion by taking the exclusive OR of one of the comparison master pattern data and the master pattern data, and the check pattern data.

5. In a method for checking a pattern wherein an object under check having a pattern to be checked is scanned two-dimensionally relative to an imaging device to obtain check pattern data, and the check pattern data is compared with previously stored master pattern data to check for a defect in the pattern to be checked, the improvement comprising the steps of: forming a deviation quantity corresponding to a pattern portion whose accuracy in a defect recognition in the master pattern data is low; forming comparison master pattern data based on the deviation allowing pattern data and the master pattern data; forming contour data of the comparison master pattern data; extracting a defective portion by comparing the comparison pattern data with the check pattern data; and judging the absence or presence of a defect in the pattern to be checked by masking the extracted defective portion with the contour data.

6. The improvement in a method for checking a pattern according to claim 5 wherein the comparison between the comparison pattern data or the master pattern data and the check pattern data is performed by taking the exclusive OR of the check pattern data and the master pattern data.

7. In the apparatus for checking a pattern wherein an object under check having a pattern to be checked formed thereon is scanned two-dimensionally relative to an imaging device to obtain check pattern data, and the check pattern data is compared with previously stored master pattern data to check for a defect in the pattern to be checked, the improvement comprising: means for forming a deviation allowing pattern which is set to a predetermined deviation quantity corresponding to a pattern portion whose accuracy in a defect recognition in the master pattern data is low; means for forming contour pattern data of the comparison master pattern data; means for extracting a defective portion by comparing the comparison master pattern data with the check pattern data; and means for masking the extracted defective portion with the contour pattern data.

8. The improvement in an apparatus for checking a patter according to claim 7 wherein the means for extracting a defective portion by taking the exclusive OR of one of the comparison master pattern data and the master pattern data, and the check pattern data.

9. In a method for checking a pattern wherein an object under check having a pattern to be checked is scanned two-dimensionally relative to an imaging device to obtain a check pattern data, and the check pattern data is compared with a previously stored master pattern data to check for a defect of the pattern to be checked, the improvement comprising the steps of: dividing the check pattern data for each one scanning line from the imaging device into a plurality of pixel groups and storing the check pattern data in a memory means; calculating an inclination of the pattern data to be checked by comparing the stored check pattern data with the master pattern data; matching the check pattern data and the master pattern data in accordance with the inclination of the pattern to be checked; forming a deviation allowing pattern which is set to a predetermined deviation quantity corresponding to a pattern portion whose accuracy in a defect recognition in the master pattern data is low; forming comparison master pattern data based on the deviation allowing pattern data and the master pattern data; forming contour pattern data of the comparison master pattern data; extracting a defective portion by comparing the comparison master pattern data with the check pattern data; and judging the absence or presence of the check pattern defective portion by masking the extracted defective portion with the contour pattern data.

10. The improvement in a method for checking a pattern according to claim 9 wherein the comparison between the comparison pattern data or the master pattern data and the check pattern data is performed by taking the exclusive OR of the check pattern data and the master pattern data.

11. In ana apparatus for checking pattern wherein an object under check having a pattern to be checked is scanned two-dimensionally relative to an imaging device to obtain a check pattern data, and the check pattern data is compared with a previously stored master pattern data to check for a defect of the pattern to be checked, the improvement comprising: means for dividing check pattern data for each one scanning line from the imaging device into a plurality of pixel groups and for detecting an inclination of the check pattern by comparing the stored check pattern data with the master pattern data; means for matching the check pattern data and the master pattern data in accordance with a check result of the inclination detection means; means for forming a deviation allowing pattern which is set to a predetermined deviation quantity corresponding to a pattern portion whose accuracy in a defect recognition in the master pattern data is low; means for forming comparison master pattern data based on the deviation allowing pattern data and the master pattern data; means for forming contour pattern data of the comparison master pattern data; means for extracting a defective portion by comparing the comparison master pattern data with the check pattern data; and means for masking defective portion extracting data with the contour pattern data.

12. The improvement in an apparatus for checking a patter according to claim 11 wherein the means for extracting a defective portion by taking the exclusive OR of one of the comparison master pattern data and the master pattern data, and the check pattern data.

* * * * *